United States Patent [19]

Akagawa et al.

[11] Patent Number: 4,880,518

[45] Date of Patent: Nov. 14, 1989

[54] DISK CARRIER

[75] Inventors: Minoru Akagawa; Satoshi Naoi, both of Fremont; Heijiro Fukumoto, San Francisco, all of Calif.

[73] Assignee: Intelmatec Corporation, Fremont, Calif.

[21] Appl. No.: 329,363

[22] Filed: Mar. 27, 1989

[51] Int. Cl.$^4$ .................. C23C 14/34; B05C 11/14
[52] U.S. Cl. .................. 204/298; 204/192.12; 118/500
[58] Field of Search ....... 204/298 R, 298 C, 298 MT, 204/298 MS, 298 WH, 298 E, 298 ET, 192.1, 192.12; 118/500, 503, 504, 728, 729, 730; 156/345

[56] References Cited

U.S. PATENT DOCUMENTS

| | | | |
|---|---|---|---|
| 4,473,455 | 9/1984 | Dean et al. | 204/298 WH |
| 4,589,369 | 5/1986 | Mahler | 118/500 |
| 4,595,481 | 6/1986 | Allen et al. | 204/298 WH |
| 4,634,512 | 1/1987 | Allen et al. | 204/192.2 X |
| 4,650,064 | 3/1987 | Slabaugh | 204/298 WH X |
| 4,735,701 | 4/1988 | Allen et al. | 118/500 X |

Primary Examiner—Nam X. Nguyen
Attorney, Agent, or Firm—Flehr, Hohbach, Test, Albritton & Herbert

[57] ABSTRACT

A disk carrier is comprised of a carrier plate having one or more throughholes at which disks are carried with both surfaces exposed to be processed. Abutting and partially around each of these throughholes is a recess such that not only can a disk be easily positioned at the throughhole without having its surface scratched but also a corner is formed in this recessed region which can serve as an indexing depression. For this purpose, the recess may be fomed with a bottom surface parallel to the surface of the carrier plate and boundary wall in the form of a part of a polygon such that two mutually adjacent straight parts thereof, together with the bottom surface, form a corner which can serve as a reference position easily accessible by a touch sensor.

9 Claims, 4 Drawing Sheets

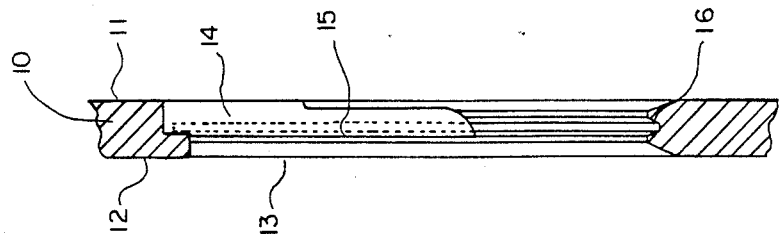
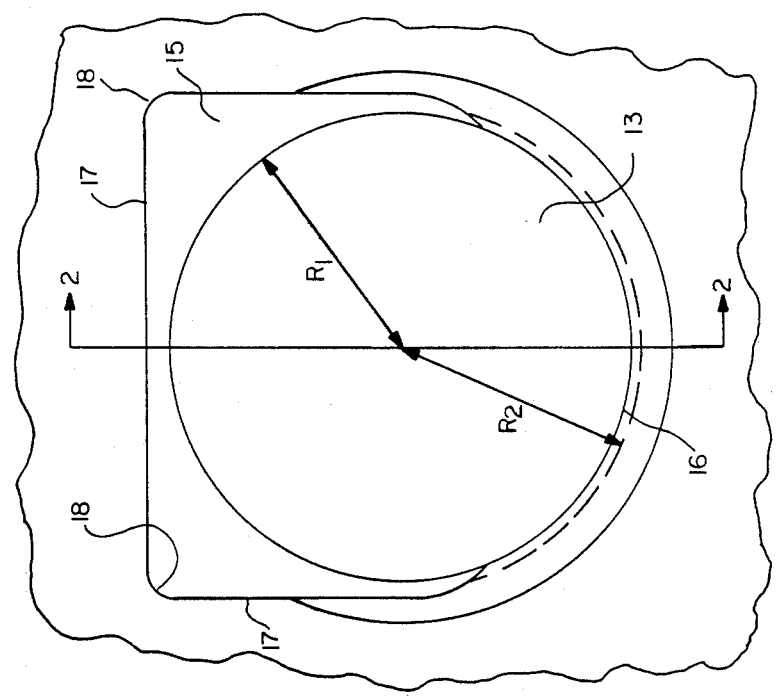

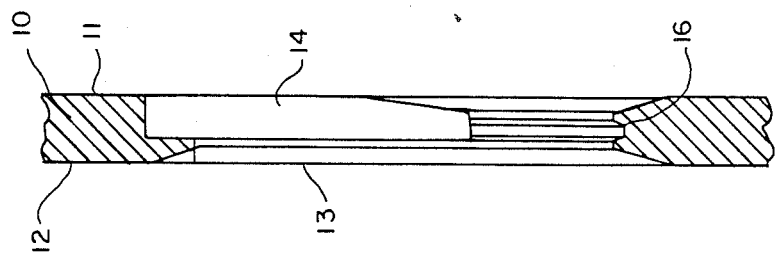
FIG.—4
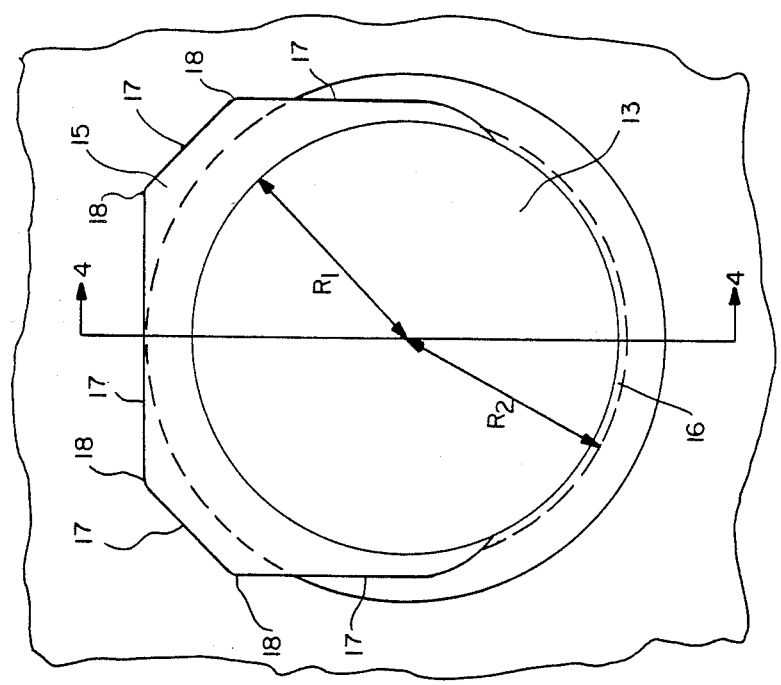
FIG.—3

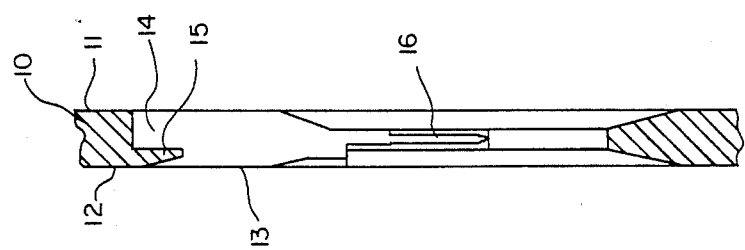
FIG.—9
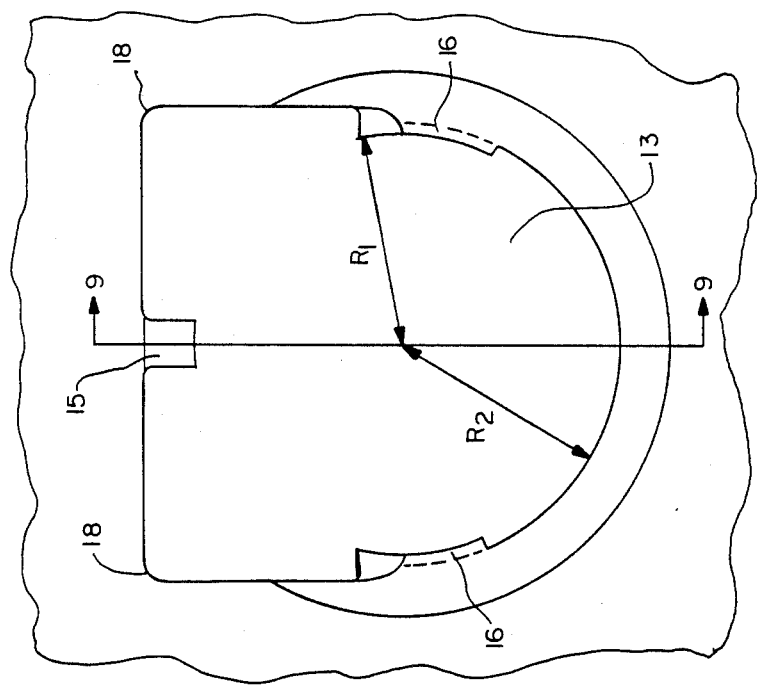
FIG.—8

DISK CARRIER

BACKGROUND OF THE INVENTION

This invention relates to a disk carrier and more particularly to a carrier for carrying memory disks during the manufacture of such disks such that both surfaces of the disks can be processed simultaneously.

Many methods of manufacturing memory disks for use, for example, in disk drives as well as apparatus to be used therefor have been known. U.S. Pat. Nos. 4,595,481 and 4,634,512 disclose disk carriers with a carrier plate having a plurality of generally circular throughholes of approximately of the size of the disks to be processed and a recessed area of a slightly larger circle formed around the top half of each of these circular throughholes. The inner walls of the throughholes are grooved along their lower halves such that each disk to be processed can be brought first to the slightly larger recessed area either manually or by a robot and then positioned in the groove at the bottom with its both surfaces exposed through the throughhole.

Since the memory disks intended for such carriers are highly fragile and easily damaged, they are currently handled almost exclusively by an automated handling apparatus. Before a robot can mount or remove a disk on or from a carrier, however, it is essential that the position of the carrier, or more specifically the position on the carrier intended for the disk be accurately determined. For this reason, use may be made of a touch sensor, for example, of the type disclosed in U.S. Pat. No. 4,734,549 having a generally pointed contact part with a spherical external surface at its forward end and sets of indexing depressions may be provided on the surface of the carrier plate. U.S. Pat. No. 4,735,701 discloses a carrier plate provided with such indexing depressions formed at equidistant positions from mutually adjacent pairs of the throughholes and the touch sensor serves to detect the three-dimensional coordinates of these depressions to instruct the robot where the next disk should be mounted or removed. Operating a touch sensor to bring its pointed contact part successively from one such indexing depression to another, however, is a cumbersome job and providing such indexing depressions specifically for this purpose adds to the manufacturing cost of the disk carrier.

SUMMARY OF THE INVENTION

It is therefore a general object of this invention to provide an improved disk carrier for carrying memory disks or the like to be processed with their both surfaces exposed for processing.

It is particularly an object of the present invention to provide such a disk carrier with which the positions at which disks are to be loaded by a robot can be determined efficiently without any indexing depressions provided on its surface specifically for this purpose.

The above and other objects of the present invention can be achieved by providing a disk carrier comprising a carrier plate having one or more throughholes at which disks are carried with both surfaces exposed to be processed and abutting and partially around each of which a recess is formed such that not only can a disk be easily positioned at the throughhole without having its surface scratched but also a corner is formed in this recessed region which can serve as an indexing depression. For this purpose, the recess is formed with a bottom surface parallel to the surface of the carrier plate and a boundary wall in the form of a part of a polygon such that two mutually adjacent straight parts thereof, together with the bottom surface, form a corner which can serve as a reference position easily accessible by a touch sensor.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings:

FIG. 1 is a plan view of a portion of a disk carrier embodying the present invention, FIG. 2 is a sectional view taken along the line 2—2 of the disk carrier shown in FIG. 1, FIG. 3 is a plan view of a portion of another disk carrier embodying the present invention, FIG. 4 is a sectional view taken along the line 4—4 of the disk carrier shown in FIG. 3, FIG. 8 is a plan view of a portion of still another disk carrier embodying the present invention, and FIG. 9 is a sectional view taken along the line 9—9 of the disk carrier shown in FIG. 8.

In all these figures, those parts that are substantially equivalent or function substantially similarly to one another are indicated by the same numerals for convenience of illustration.

DETAILED DESCRIPTION OF THE INVENTION

Figure 7:
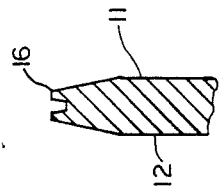
FIG. 7 is another sectional view taken along the line 7—7 of the disk carrier shown in FIG. 5.

Disk carriers according to the present invention comprise a carrier plate having one or more generally circular throughholes where disks are to be carried with both surfaces substantially entirely exposed for processing. The number of throughholes to be provided depends on the number of disks desired to be processed simultaneously and this, in turn, is limited by the allowable maximum size of the plate and the dimension of the disks to be carried. Since neither the number of these throughholes to be provided nor the manner in which they are to be distributed on the plate limits the scope of the present invention, and since the present invention relates to the structure of these throughholes and their neighboring regions, only a region around one of the throughholes will be illustrated for each disk carrier described herein as embodying the present invention but it is repeatedly emphasized that this is merely for the convenience of illustration and hence that the present invention is not limited to disk carriers adapted to carry only one disk. In the figures illustrating various embodiments of the present invention, numeral 10 indicates a carrier plate with its front and back surfaces respectively indicated by 11 and 12.

A portion of a disk carrier embodying the present invention including one of its throughholes 13 is shown in FIGS. 1 and 2. The throughhole 13 according to this embodiment of the invention is circular with radius $R_1$ which is slightly smaller than the radius $R_2$ of the disk intended for this carrier. A recess 14 is formed from the front surface 11 partially around the throughhole 13.

The recess 14 which characterizes the present invention is of a uniform depth, or has a bottom surface 15 which is parallel to the front surface 11 of the plate 10 and abuts slightly more than one half of the circumference of the throughhole 13. A groove 16 is formed circumferentially on the portion of the inner wall of the throughhole 13 not abutting the recess 14 such that the bottom of the groove 16 is circular with the radius equal to $R_2$. With the recess 14 and the groove 16 thus formed around the throughhole 13, a disk with radius $R_2$ can be deposited at the throughhole 13 and with its bottom edge supported by the groove 16.

The part of the recess 14 not abutting the throughhole 13 is characterized as having a boundary wall 17 with straight sections substantially forming a part of a rectangle (with a horizontal section and two vertical sections if the plate is oriented vertically). In other words, mutually adjacent sections of the boundary wall are perpendicular to each other, forming therebetween a corner 18. The corners 18 thus defined are not sharp but are slightly rounded with a radius equal to the external spherical surface of the contact part of a touch sensor intended to be used for determining the exact position of the throughhole 13, or the position to which a robot should be commanded to deliver a disk to be processed. With the recess 14 thus formed with corners 18 which can serve as reference positions, a touch sensor of the aforementioned type can be operated more speedily (say, by 3-5%) to measure the three-dimensional coordinates (determined by two boundary wall sections 17 and the bottom surface 15 of the recess 14) of these reference positions than if the pointed contact part of the touch sensor must be carefully maneuvered to the precise locations of prior art indexing depressions. In other words, the disk carrier according to the present invention makes it possible to load disks thereon more easily and hence to speed up the overall processing of the disks. In FIG. 2, dotted lines indicate the position at which a disk is intended to rest when it is mounted properly.

Figure 6:
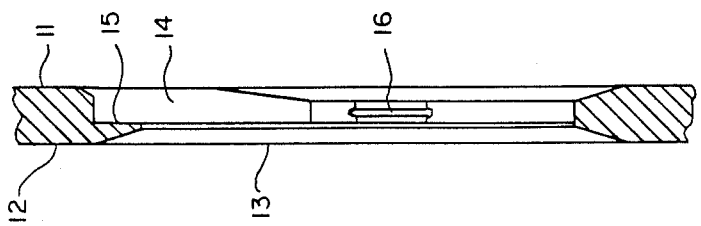
FIG. 6 is a sectional view taken along the line 6—6 of the disk carrier shown in FIG. 5.
Figure 5:
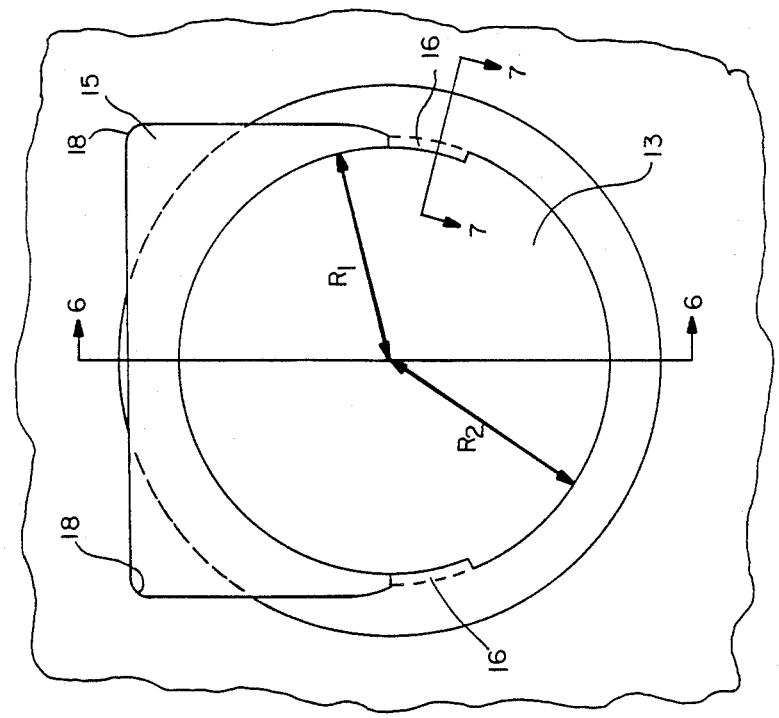
FIG. 5 is a plan view of a portion of still another disk carrier embodying the present invention.

FIGS. 3 and 4 show a portion of another disk carrier embodying the present invention different from the one described above by way of FIGS. 1 and 2 in that the part of the recess 14 not abutting the throughhole 13 is not rectangular but rather a portion of an octagon such that mutually adjacent straight sections of its boundary wall 17 make an angle of 135° therebetween. The corners 18 thus formed are also easily accessible and their three-dimensional coordinates can be measured easily. Still another disk carrier embodying the present invention is shown in FIGS. 5, 6 and 7. This disk carrier is similar to the one described above by way of FIGS. 1 and 2 but is different in that the portion of the internal wall of the throughhole 13 not abutting the recess 14 has the same radius $R_2$ as the disk to be mounted and is flat as shown in FIG. 6 without having a groove formed thereon. Instead, relatively shorter grooves 18 are formed at two sections around the circumference of the throughhole 13 slightly below where the inner wall will be vertical if the carrier plate 10 is placed vertically. This embodiment is advantageous in that the trouble of cleaning dust particles from grooved sections can be obviated.

FIGS. 8 and 9 show a further example of disk carriers embodying the present invention which is similar to the one described above by way of FIGS. 5, 6 and 7 but is modified therefrom such that the throughhole 13 is enlarged to take substantially entirely the place of the recess 14 shown in FIG. 5. This embodiment also enjoys the advantage that dust particles accumulated in the grooves 16 can be removed easily.

The foregoing description of preferred embodiments of the invention has been presented for purposes of illustration and description. It is not intended to be exhaustive or to limit the invention to the precise forms disclosed, and many modifications and variations are possible in light of the above teaching. For example, features shown in the illustrated examples may be appropriately combined.

The octagonal shape of the recess 14 shown in FIG. 3 may be incorporated in the embodiments shown in FIGS. 5 and 8. The recess 14 may be of a different polygonal shape as long as an easily accessible corner capable of serving as a reference position for a touch sensor can be provided. The semicircular portion of the throughholes 13 need not be exactly one half of a circular circumference as long as a disk can be efficiently mounted without having its surfaces damaged. Any such modifications and variations that may be apparent to a person skilled in the art are intended to be included within the scope of this invention.

What is claimed is:

1. A disk carrier for supporting a disk at a precisely specifiable position with both surfaces of said disk exposed substantially entirely for processing, said disk carrier comprising
    a carrier plate,
    at least one generally circular throughhole formed through said disk plate, said throughhole having an inner wall and a diameter slightly less than the diameter of said disk,
    a recessed area formed partially around said throughhole, said recessed area abutting at least one half of the circumference of said circular throughhole, and
    a groove with width substantially equal to the thickness of said disk formed on a distal part of said inner wall of said circular throughhole not abutting said recessed area,
    said recessed area having a bottom surface and a boundary wall with at least two mutually adjacent straight sections which form together with said bottom surface a corner serving as a reference position, whereby the three-dimensional coordinates of said corner can be determined by a touch sensor with a pointed contact part.

2. The disk carrier of claim 1 wherein said mutually adjacent straight sections of said boundary wall are perpendicular to each other.

3. The disk carrier of claim 1 wherein said boundary wall of said recess has a shape of a portion of a polygon.

4. A disk carrier for supporting a disk at a precisely specifiable position with both surfaces of said disk exposed substantially entirely for processing, said disk carrier comprising
    a carrier plate having a planar front surface,
    a throughhole formed through said disk plate, said throughhole having an inner wall with a substantially semicircular part and a non-circular part, said semicircular part having a diameter slightly less than the diameter of said disk, said non-circular part having at least two mutually adjacent straight sections in said inner wall to define a corner therebetween which can serve as a reference position detectable by a touch sensor, pairs of elongated protrusions on said semicircular part of said inner wall of said throughhole, forming therebetween a groove for supporting therein an edge part of said disk, and a member protruding inward from said non-circular part of said inner wall, said member having a flat surface which is parallel to and recessed from said planar front surface of said carrier plate.

5. The disk carrier of claim 4 wherein said pairs of protrusions are formed on limited portions of said semicircular part of said inner wall of said throughhole near said non-circular part of said inner wall.

6. The disk carrier of claim 5 wherein said pairs of protrusions are nearly diametrically opposite from each other with respect to said throughhole.

7. A disk carrier for supporting a disk at a precisely specifiable position with both surfaces of said disk exposed substantially entirely for processing, said disk carrier comprising a carrier plate, at least one generally circular throughhole with a smooth inner wall formed through said disk plate, a recessed area formed partially around said throughhole, said recessed area abutting at least one half of the circumference of said circular throughhole, the circumference of said throughhole abutting said recessed area having a diameter slightly less than that of said disk and the circumference of said throughhole not abutting said recessed area having substantially the same diameter as said disk, and pairs of elongated protrusions on said inner wall of said throughhole forming therebetween a groove for supporting therein an edge part of a disk, said recessed area having a bottom surface and a boundary wall with at least two mutually adjacent straight sections which form together with said bottom surface a corner serving as a reference position, whereby the three-dimensional coordinates of said corner can be determined by a touch sensor with a pointed contact part.

8. The disk carrier of claim 7 wherein said pairs of protrusions are formed on limited portions of the circumference of said throughhole and abut said boundary wall of said recessed area.

9. The disk carrier of claim 7 wherein said pairs of protrusions are nearly diametrically opposite from each other with respect to said throughhole.

* * * * *